United States Patent [19]

Setoyama et al.

[11] Patent Number: 5,116,482

[45] Date of Patent: May 26, 1992

[54] FILM FORMING SYSTEM USING HIGH FREQUENCY POWER AND POWER SUPPLY UNIT FOR THE SAME

[75] Inventors: Eiji Setoyama; Mitsuhiro Kamei, both of Hitachi, Japan

[73] Assignee: Hitachi, Ltd., Tokyo, Japan

[21] Appl. No.: 587,034

[22] Filed: Sep. 24, 1990

[30] Foreign Application Priority Data

Sep. 22, 1989 [JP] Japan .................. 1-247322

[51] Int. Cl.⁵ .............. C23C 14/34; C23C 14/54
[52] U.S. Cl. ............... 204/298.08; 204/298.03; 204/298.34; 118/723
[58] Field of Search .............. 204/192.13, 192.33, 204/298.03, 298.08, 298.32, 298.34; 118/723; 156/345

[56] References Cited

FOREIGN PATENT DOCUMENTS

| | | | |
|---|---|---|---|
| 59-205477 | 11/1984 | Japan | 204/298.08 |
| 60-29467 | 2/1985 | Japan | 204/298.08 |
| 62-4864 | 1/1987 | Japan | 204/298.08 |
| 64-11971 | 1/1989 | Japan | 204/298.08 |

OTHER PUBLICATIONS

A. Halperin et al, *J. Vac. Sci. Technol.*, vol. 15, No. 1, pp. 116-118 (1978).

*Primary Examiner*—Aaron Weisstuch
*Attorney, Agent, or Firm*—Antonelli, Terry Stout & Kraus

[57] ABSTRACT

A film forming system including an evacuating unit, a pair of opposed electrodes and an RF voltage supplying unit for suppling RF voltages to the respective electrodes to generate a discharge between the electrodes to form a film. The film forming system includes: a discharge variation detecting unit for detecting an amount of a variation in the discharge as a voltage from each of the electrodes; and a phase adjusting unit for detecting the difference in phase between the RF voltages supplied to the electrodes, and for adjusting the phase difference of the RF voltages supplied to the electrodes, according to the difference between the detected phase difference and a preset value.

6 Claims, 3 Drawing Sheets

FILM FORMING SYSTEM USING HIGH FREQUENCY POWER AND POWER SUPPLY UNIT FOR THE SAME

BACKGROUND OF THE INVENTION

The present invention relates to a film forming system having a pair of opposed electrodes to which high frequency power supply voltages are supplied. The present invention particularly but not exclusively relates to a high frequency bias sputtering system in which high frequency power supply voltages are applied to a substrate electrode and a target electrode for performing high frequency bias sputtering.

A typical example of a conventional high frequency or radio frequency (hereinafter referred to as RF) bias sputtering system is disclosed in Japanese Patent (unexamined) Laid-open Publication 63(1988)-18071, in which RF power is applied as target bias to a target electrode from an RF power supply and RF power is also applied as substrate bias to a substrate electrode from the power supply voltages supply. The RF powers must be simultaneously applied to the electrodes in bias sputtering.

When the RF power is applied to the target electrode in such a simultaneous manner, an RF discharge plasma is formed between the target electrode and the substrate electrode. In the plasma, more ions gather at the target than at the substrate, because of a difference between mobility of ions and electrons, so that a cathode dark space is formed in the vicinity of the target. Thus, negative bias is induced on the surface of the target, which is hence bombarded by ions due to the attractive force of the electric field, thereby sputtering the target material. When the RF power is supplied to the substrate electrode, the surface of the substrate is also bombarded by ions, as is the target, and thus reverse sputtering of the substrate occurs.

In the bias sputtering, adjustment of the power supply voltages of the electrodes enables the plasma confinement to be enhanced in efficiency and a flat film to be formed over an irregular surface of the substrate.

It is empirically known that when the RF power supply voltage applied to the electrodes are maintained within a predetermined range of phase difference, desired effects are produced for stabilization of discharge and for improving efficiency. An attempt which has taken this finding into consideration is reported in *IBM Technical Disclosure Bulletin*, Vol. 14, 1032 (1971), in which power is supplied to a substrate electrode and a target electrode from the same RF power supply by RF power supply cables, and an appropriate cable length is selected for one of the RF power supply cables.

In this earlier attempt, the RF power supply voltages which are applied to the electrodes are liable to be shifted in phase due to variations of film forming parameters at the start of the sputtering and due to changes of the parameters with the lapse of time even if the substrate electrode and the target electrode are each supplied with RF power from the same power source on the condition that a correct phase relationship is established by adjusting the cable length as described. This results in that the discharge becomes unstable.

Recently, high has become required for thin films as thin film devices become highly functional. Thus, such an instability of discharge largely affects properties of the thin films formed by the technique and should be suppressed as much as possible. For this purpose, it is essential to control discharge parameters to predetermined values in addition to the other values to be controlled.

Another attempt is disclosed in Japanese Patent (unexamined) Laid-open No. 59 (1984)-205477, in which a uniform thin film is formed over a substrate by applying RF power supply voltages, having different phases, to a target electrode and a substrate electrode of an RF bias sputtering system.

In this RF bias sputtering system, the RF output of the RF power supply unit is split to apply it to the target electrode and the substrate electrode through a phase adjusting device. The RF bias sputtering system has a phase detecting circuit arranged in each power supply cable connected to the corresponding electrode. Output signals of the phase detecting circuits are inputted to a phase difference detector, where a voltage proportional to the phase difference between the RF powers is produced according to the signals. Thus, the sputtering is performed by keeping the phase difference between the RF voltages of the electrodes at a predetermined value by the phase adjusting device according to the produced voltage.

This RF bias sputtering system is superior to the other conventional sputtering systems in that the phase difference between RF voltages of the electrodes is constantly maintained. However, the phase detecting circuits which are provided in the power supply cables are influenced by inductance and capacitance of the cables, and hence it is not possible to exactly detect a change in phase due to a variation in the state of discharge. Thus, the RF bias sputtering system is inferior to the other known art in accuracy of the voltage phase control of the applied powers, and hence it is hard to stabilize the discharge. The known RF bias sputtering system this is insufficient to form a thin film of high performance.

Moreover, in the known RF bias sputtering system the phase adjusting device adjusts phases of the RF power supply voltages sent to the power supply cables, and hence the phase adjusting device must withstand high voltages. This results in that the phase adjusting device becomes large sized and costly.

SUMMARY OF THE INVENTION

Accordingly, it is an object of the present invention to provide a film forming system which is capable of detecting changes in the phase of applied RF voltages due to variation of the discharge state without influences of inductance and capacitance of the power cables while phase control is achieved with an excellent accuracy to correspond to both variations of film forming parameters and various influences with the lapse of time.

It is another object of the present invention to provide an RF power supply unit which is capable of performing the phase control above described at a relatively low voltage for reducing the size of the unit.

With these and other objects in view, one aspect of the present invention is directed to a film forming system of the type including evacuating means, a pair of opposed electrodes, and RF voltage supplying means for supplying RF voltages to the respective electrodes to generate a discharge between the electrodes to form a film. The film forming system comprises: discharge variation detecting means for detecting an amount of a variation in the discharge as a voltage from each of the electrodes; and phase adjusting means for detecting a difference in phase between the RF voltages supplied to the electrodes, according to the detected voltages and for shifting the phase of the RF voltages supplied to the electrodes according to the difference between the detected phase difference and a preset value.

Preferably, the RF voltage supplying means comprises an RF oscillator, a first amplifier for amplifying an output of the RF oscillator to output an RF voltage, and a second amplifier for amplifying an output of the RF oscillator to output an RF voltage. The discharge variation detecting means comprises monitor sensors provided to the respective electrodes for detecting voltages of the electrodes. The phase adjusting means is interposed between the oscillator and one of both the first and the second amplifiers, and hence the phase adjusting means can perform phase adjustment at relatively low voltage. This enables the phase adjusting means to be reduced in size. The phase of each RF voltage applied to the corresponding electrode considerably changes at various components, e.g., matching boxes which have a matching network, RF leads and connection portions. For this reason, the monitor sensors directly monitor signals from the electrodes and output them as feedback signals.

In another preferred mode of the present invention, the phase adjusting means comprises: difference detecting means for detecting the difference between the phase difference of the RF voltages and the preset value; and phase shifting means for shifting the phase of the output of the one amplifier so as to reduce the difference detected by the difference detecting means.

The film forming system may preferably comprise optimal value setting means for setting an optimal value as the preset value according to each step of the film forming. Thus, an optimal control is performed for each step of the film forming.

Preferably, one of the electrodes is a target electrode and the other is a substrate electrode for RF bias sputtering.

According to another aspect of the present invention, there is provided an RF voltage supply unit which is connected to a pair of opposed electrodes, arranged within a vacuum chamber of a film forming system, to supply RF voltages to produce a discharge for forming a film over a substrate held on one of the electrodes. The RF voltage supply unit comprises: an RF oscillator; a first amplifier for amplifying an output of the RF oscillator to output an RF voltage; a second amplifier for amplifying the output of the oscillator to output an RF voltage; and phase adjusting means, interposed between the RF oscillator and one of both the first and the second amplifiers, for shifting the phase of an output voltage of the one amplifier.

The RF voltages which are applied to the target electrode and the substrate electrode are preferably equal in frequency. It is preferable to use a single oscillator since usual quartz oscillators are not exactly equal in frequency.

DETAILED DESCRIPTION OF THE PREFERRED EMBODIMENTS

Figure 1:
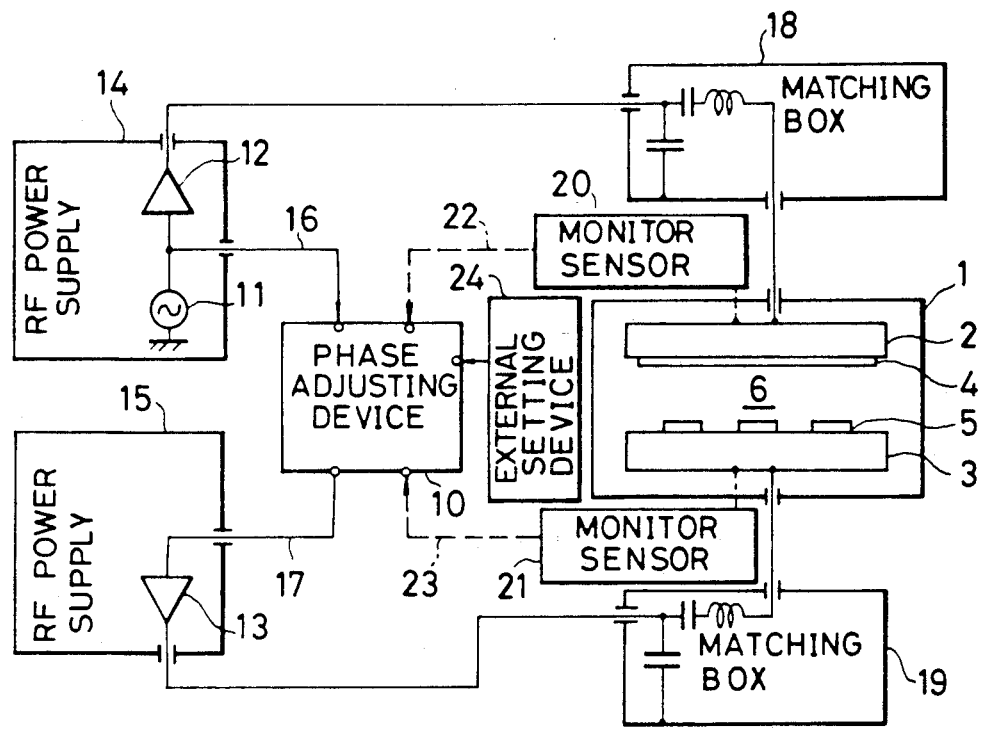
FIG. 1 is a block diagram illustrating an RF circuit system of an RF bias sputtering system according to the present invention.

The invention will now be described with reference to the drawings, in which corresponding parts are designated by the same reference numerals and descriptions thereof are omitted after once given.

FIG. 1 illustrates an RF bias sputtering system of the present invention. The RF bias sputtering system includes a vacuum chamber 1 for sputtering, RF power sources 14 and 15, matching boxes 18 and 19, a phase adjusting device 10 and monitor sensors 20 and 21.

The vacuum chamber 1 accommodates a target electrode 2 and a substrate electrode 3, the former having a target member 4 as a base material of a film and the latter holding pieces of substrates 5 on which the film is layered. RF power is supplied from the RF power source 14 to the target electrode 2 through the matching box 18. Similarly, RF power is applied from the RF power source 15 to the substrate electrode 3 through the matching box 19.

The RF power source 14 is made up of the oscillator 11 and an amplifier 12 for amplifying an output of the oscillator 11. The RF power source 15 is provided with an amplifier 13, which amplifies an output of the oscillator 11 which is supplied to and from the phase adjusting device 10 through signal lines 16 and 17, respectively.

The monitor sensors 20 and 21 are composed of LC elements. The monitor sensor 20 is connected to the target electrode 2 whereas and the monitor sensor 21 to the substrate electrode 3. Outputs of the monitor sensors 20 and 21 are inputted through monitor cables 22 and 23, respectively, to the phase adjusting device 10.

The monitor sensors 20 and 21, which are each composed of the LC elements, cut off high frequency components by means of inductance L and divides and outputs the voltage of the respective electrode by means of capacitance C.

An RF discharge plasma is induced by the applied RF power in the space 6 between the substrate electrode 3 and the target electrode 2. Generally, a film is formed by depositing sputtered particles of the target member 4, to which large power is applied, on a surface of the substrates 5. The surface of the substrates 5 is similarly eroded by reverse sputtering since the RF power of the substrate electrode 3 is relatively low. However, the forming of the film proceeds because the amount of deposition of the target material is larger than the amount of the substrate material sputtered off.

When the substrate and the target are equal in RF phase and frequency, the RF power supply oscillation frequency is shifted a little, and the phase changes according to the RF circuit and load conditions. To avoid these drawbacks, a common output of the oscillator 11 of the RF power source 14 is used. The oscillator output is split, and one of the oscillator outputs is sent to the amplifier 12 in the same power supply 14 whereas the other oscillator output is inputted to the phase adjusting device 10 through the signal cable 16. In the phase adjusting device 10, the split output is adjusted in phase to conform to a signal from an external setting device 24 and then is sent to the amplifier 13 of the other RF power source 15 through the signal cable 17.

The split RF outputs are applied to respective electrodes 2 and 3.

The electrodes 2 and 3 are provided with monitor sensors 20 and 21 including LC elements, respectively. Thus, electrical variations in the electrodes 2 and 3 are detected by the monitor sensors 20 and 21 and are inputted to the phase adjusting device 10 as feedback signals.

In the phase adjusting device 10, a phase difference is detected by comparing output signals from the monitor sensors 20 and 21, and the difference between the phase difference and a preset value set by the external setting device 24 is determined. According to the difference, the output of the oscillator 11 is advanced or delayed in phase and is then sent to the amplifier 13 of the RF power source 15.

Thus, a variation in the discharge state is detected by the monitor sensors 20 and 21. According to the amount of the variation, the phase difference between the RF powers applied to the electrodes 2 and 3 is adjusted and in this manner the discharge continues. The shift in phase relationship between the RF powers due to a variation in the discharge state is automatically corrected by repeating these procedures.

The shift in phase relationship refers to not only a shift of phase which had been equal but also to a variation of a phase difference which has been preset. Generally, the latter case occurs more frequently than the former.

In this embodiment, the phase of each of the RF voltages applied to the target electrode 2 and the substrate electrode 3 is maintained at a predetermined value. The phase relationship is set to a desired one by varying the set value of the external setting device 24.

When a bias voltage or applied power supply voltages are changed during the film forming process, the optimal phase relationship between the electrodes 2 and 3 changes. Thus, it is preferable to vary the set signal of the external setting device 24 so that the RF power supply voltage have phases to correspond to these changes. For this purpose, the external setting device 24 may be designed so that it is capable of varying the preset value during the film forming process.

For instance, when in the RF bias sputtering system, the sputtering process changes in the order of cleaning, presputtering, non-bias sputtering and bias sputtering, parameters such as discharge impedance must vary to correspond to such changes. For this purpose, it is preferable to prepare a program to determine an optimal phase difference to match the progress of the sputtering process so that an optimal phase relationship can be set at each step. The optimal phase difference is chosen according to the program. This control may be performed by a control unit using a microcomputer as described hereinafter. The microcomputer preferably executes the program concurrently with the control of the sputtering process.

In the embodiment, the phase difference between the target electrode 2 and the substrate electrode 3 can be, as described, preset to a desired value, which may be maintained. Thus, it is possible to preset the phase difference so as to provide a proximal and highest bias voltage, so that plasma confinement can be enhanced in efficiency. An increase in plasma confinement efficiency enhances the rate of deposition and improves properties of the deposited film such as film thickness distribution and crystalline property.

Moreover, in this embodiment, a variation of plasma during discharging is detected as potential signals by the monitor sensors 20 and 21 provided to the electrodes 2 and 3, and hence the variation can be exactly detected. This is quite different from a case where monitor sensors are provided to the power supply cables. In the latter case, detection of the variation of plasma is affected by impedance such as the inductance of the power supply cables. Consequently, accurate adjustment of RF power supply voltages other than RF phases can be achieved by processing the outcomes of the detection according to a predetermined relationship. Thus, stable film forming conditions can be provided.

In the embodiment, monitor sensors 20 and 21 using LC elements are used for detecting a variation in the discharge state in each electrode, but the present invention is not limited to this structure. For example, the voltage of each electrode may be divided through a high resistance. The divided voltages are sampled at a predetermined cycle and then converted to digital values, which are then compared by means of a microcomputer or like means to detect a phase difference.

Figure 3:
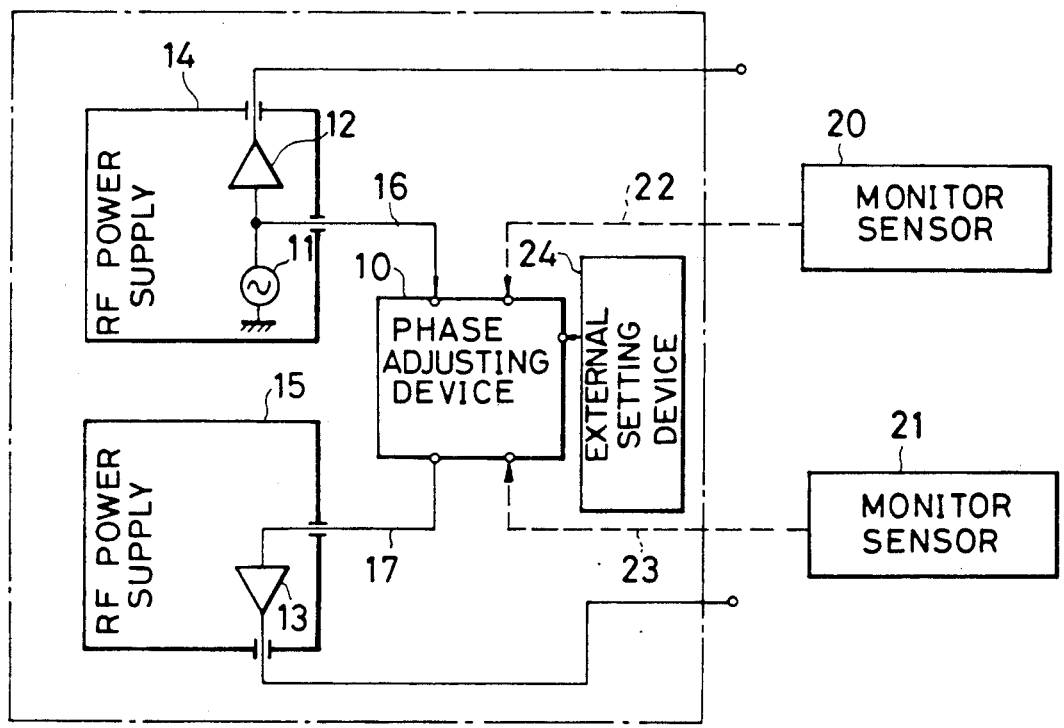
FIG. 3 is a block diagram of a modified form of the power supply unit of FIG. 1.

Although in the embodiment the RF power sources 14 and 15 and the phase adjusting device 10 are separate units, they may be incorporated into a single RF power supply unit. The RF power supply unit may be constituted by the same elements of FIG. 1. More specifically, the RF power supply unit is, as illustrated in the portion denoted by the dot-and-dash line in FIG. 3, provided with an oscillator 11, two amplifiers 12 and 13 and a phase adjusting device 10 which includes a phase difference setting device. As in the embodiment of FIG. 1, the output of the oscillator 11 is split into two outputs, one of which is provided to one of the amplifiers 12. The other is inputted to an amplifier 13 through a phase adjusting device 10. Also in this modified power unit, the phase adjusting device 10 is connected to an external setting device 24 and to monitor sensors 20 and 21 thorough respective monitor cables 22 and 23.

With such a structure of the RF power unit, phase adjustment can be made on an oscillator output of a low voltage, and hence the phase adjusting device 10 may be reduced in size and production cost. As a result, the RF power unit may be small sized.

A preferred phase adjusting device suitably used in both the embodiment of FIG. 1 and the RF power supply unit of FIG. 3 will be described with reference to FIG. 2.

The preferred phase adjusting device 10 includes a phase difference detector 31, a differential amplifier 32, a phase shifter 30 and an external setting device 24. The phase difference detector 31 detects the phase difference between outputs of monitor sensors 20 and 21, the outputs being inputted through monitor cables 22 and 23. The difference between the phase difference detected and the preset value given by the external setting device 24 is amplified by the differential amplifier 32. The output of an oscillator 11 is advanced or delayed in phase by the phase shifter 30 to correspond to the amplified difference. By repeating the procedures, the phase of the oscillator output is automatically adjusted according to feedback control until the result of the detection coincides with the setting signal.

In the preferred phase adjusting device 10, the external setting device 24 may be a potentiometer or potentiometric controller, for example, and may be provided inside or outside the phase adjusting device 10. As described above, a command signal from a microcomputer may be used as a setting signal.

The phase adjusting device 10 of this preferred mode is provided with several terminals: a pair of input terminals 10a and 10b which are connected to the monitor cables 22 and 23, respectively; an input terminal 10c connected to the oscillator 11 for inputting the oscillator output; an output terminal 10d to provide to the amplifier 12 an output 1 ($\phi=0$) which is not shifted in phase; and an output terminal 10e to output an output 2 to the amplifier 13, the phase $\phi$ of the output 2 being shifted within a range of $\pm 180°$.

In the preceding embodiments, the invention is applied to an RF bias sputtering system, but the invention is not limited to such sputtering system. For example, the invention may be applied to an RF sputtering system using opposed targets.

Figure 4:
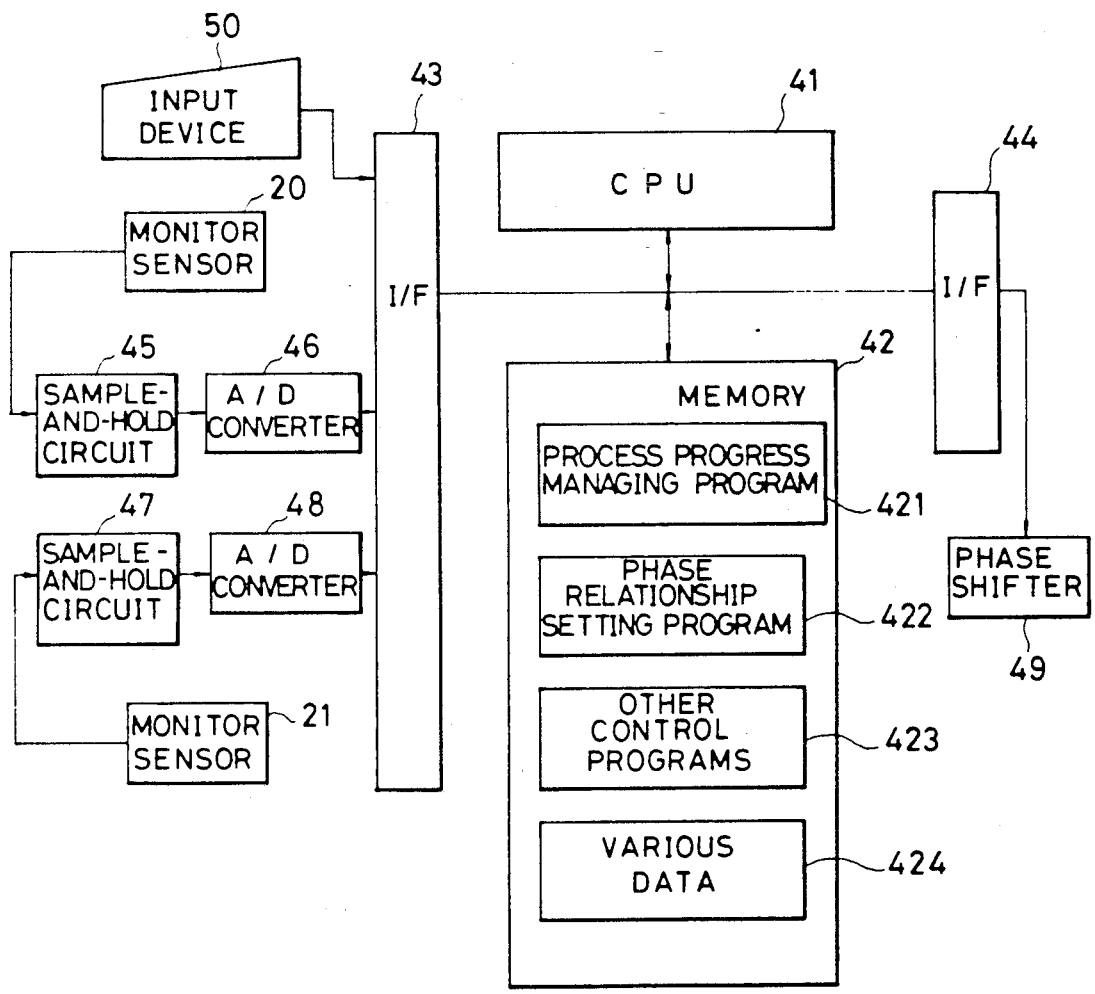
FIG. 4 is a block diagram of a control unit preferably used for the film forming system of FIG. 1.

FIG. 4 illustrates a preferred control unit used for controlling the film forming system of the present invention. The control unit includes a central processing unit (CPU) 41, a memory 42, an input interface 43 and an output interface 44.

Information representing a variation in the discharge state of a target electrode 2 is inputted from a monitor sensor 20 to the input interface 43 through a sample-and-hold circuit 45 and an analog-digital converter 46. Similarly, information indicating a variation of the discharge state of a substrate electrode 3 is inputted from a monitor sensor 21 to the input interface 43 through a sample-and-hold circuit 47 and an analog-digital converter 48. The input interface 43 is further connected to an input device 50 such as a keyboard for inputting various instructions and parameters.

Figure 2:
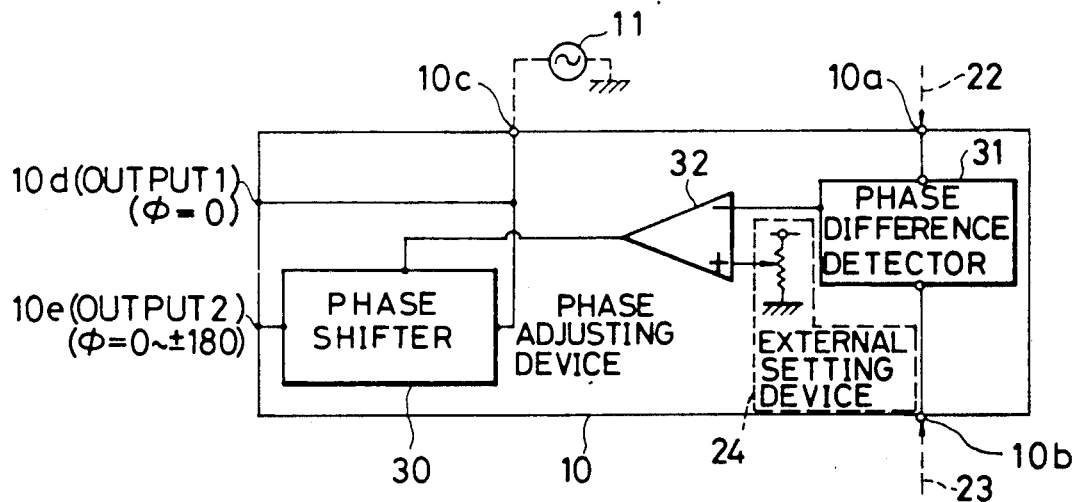
FIG. 2 is a block diagram of a preferred form of the phase adjusting device of FIG. 1.

The output interface 44 is connected to a phase shifter 49, which functions similarly to the phase shifter 30 shown in FIG. 2. The output interface 44 may be connected to a CRT display, a printer or other peripheral equipment according to the need.

The memory 42 stores various programs and data: a process progress managing program 421 to manage the progress of the sputtering process; a phase relationship setting program 422 for setting the relationship in voltage phase between RF powers outputted from the RF power sources 14 and 15 above described; other control programs 423; and various data 424 such as parameters necessary for executing each of the programs above described.

The phase relationship setting program 422 controls the voltage phase relationship between the RF powers according to the progress of the process by the process progress managing program 421. In the phase relationship setting program 422, optimal phase relationships are set in a table to respond to each of the steps of the sputtering, such as cleaning, presputtering, non-bias sputtering and bias sputtering.

The control of the film forming system is performed by executing the phase relationship setting program 422 stored in the memory 42. The CPU 41 firstly determines the difference in phase between voltage signals of the target electrode 2 and the substrate electrode 3. Next, the phase difference is compared with the optimal phase difference, which has been set for the corresponding step of the sputtering, to obtain the difference, which is then outputted as a phase shifter command signal. The latter signal is sent to the phase shifter 49 through the output interface 44.

The phase shifter 49 sets the phase difference between the target electrode 2 and the substrate electrode 3 according to the command signal.

The preceding embodiments enable a variation of film forming conditions to be controlled by adjusting the phase difference between two electrodes to which RF voltages are applied. The variation of film forming conditions is due to a variation of a discharge state. Thus, it is possible to form a film under stable conditions.

Moreover, it is possible to set an optimal and highest bias voltage, so that plasma confinement can be enhanced in efficiency. An increase of plasma confinement efficiency fairly enhances the rate of deposition and improves the properties of film such as film thickness distribution.

Preferably, the phase adjusting device outputs a phase adjusting signal in response to bias voltages applied to the electrodes and the RF power automatching (auto-tuning) even if the impedance of the RF circuit due to the discharge state of the load. In this case, the phase adjusting device outputs a phase adjusting signal to advance or delay one of the power supplies in phase.

To increase accuracy, it is preferable to provide a correcting function to the voltage splitting circuit of each monitor signal since the signals are subjected to a variation of the discharge impedance.

What is claimed is:

1. In a film forming system of a type including an evacuating arrangement, a pair of opposed electrodes, and an RF voltage supplying device for supplying RF voltages to the respective electrodes to generate a discharge between the electodes to effect film depositon comprising one or more steps, the improvement which comprises:
   a setting device for presetting a value representing a phase relationship between RF voltages applied to the opposed elecrodes for each step of the film deposition;
   a discharge variation detecting device for detecting an amount of a variation in the discharge as a voltage from each of the electrodes; and
   a phase adjusting device for detecting the difference in phase beteeen the RF voltages supplied to the electrodes and for adjusting the phase difference of the RF voltages supplied to the electrodes according to the difference between the detected phase difference and the preset value.

2. A film forming system as recited in claim 1, wherein:
   the RF voltage supplying device comprises an RF oscillator, a first amplifier for amplifying an output of the RF oscillator to output a first RF voltage, and a second amplifier for amplifying an output of the RF oscillator to output a second RF voltage; and
   the phase adjusting device is interposed between the oscillator and one of the first and the second amplifiers for shifting the phase of the output of the one amplifier; and
   the discharge vatriation detecting device comprises monitor sensors connected to respective said electrodes for detecting voltags of the electrodes.

3. A film forming system as recited in claim 2, wherein the phase adjusting device comprises:
   a difference detecting device for detecting the difference between the phase difference of the RF voltages and the preset value; and
   a phase shifting device for shifting the phase of the output of the one amplifier so as to reduce the difference detected by the difference detecting device.

4. A film forming system as recited in claim 3, wherein said setting device for presetting the phase relationship is an optimal phase difference setting device for presetting an optical phase difference for each step of the film deposition according to a program.

5. A film forming system as recited in claim 1, 2, 4 or wherein one of the electrodes is a target electrode and the other is a substrate electrode for RF bias sputtering.

6. In an RF power supply unit which is to be connected to a pair of opposed electrodes arranged within a vacuum chamber of a film forming system to supply RF voltages to produce a discharge for effecting film deposition comprising one or more steps, the improvment which comprises:
   an RF oscillator;
   a first amplifier for amplifying an output of the RF oscillator to output an RF voltage;
   a second amplifier for amplifying an output of the RF ocillator to output an RF volage; and
   a phase adjusting device, interposed between the RF oscillator and one of the first and the second amplifiers, for shifting the phase of an output voltage of the one amplifier,
   said phase adjusting device including an external setting device for presetting a value representing a phase relationship between RF volatages applied to the opposed electrodes for each step of the film deposition and a monitor sensor for dectecting an amount of a variation in the discharge as a voltage from each of the electrodes; said setting device and said monitor sensor being connected to said phase adjusting device; and said phase adjusting device further including a circuit for detecting a difference in phase between RF voltages supplied to the electrodes, based on an output from the monitor sensor, and for relatively shifting the RF voltages supplied to the electrodes, in phase, according to a difference between the detected phase difference and the preset value.

* * * * *